(12) United States Patent
Kim

(10) Patent No.: US 8,911,848 B2
(45) Date of Patent: Dec. 16, 2014

(54) CCL AND METHOD OF MANUFACTURING THE SAME

(71) Applicant: Samsung Electronics Co., Ltd., Gyeonggi-do (KR)

(72) Inventor: Young Kyung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 13/681,872

(22) Filed: Nov. 20, 2012

(65) Prior Publication Data

US 2013/0136887 A1    May 30, 2013

(30) Foreign Application Priority Data

Nov. 24, 2011 (KR) .......................... 10-2011-0123536

(51) Int. Cl.
*H05K 1/05* (2006.01)
*H05K 3/00* (2006.01)
*H05K 3/02* (2006.01)

(52) U.S. Cl.
CPC ...... *H05K 1/056* (2013.01); *H05K 2201/09154* (2013.01); *H05K 3/0061* (2013.01); *H05K 2201/0909* (2013.01); *H05K 2201/09845* (2013.01); *H05K 2201/0761* (2013.01); *H05K 2201/09827* (2013.01); *H05K 2201/09145* (2013.01); *H05K 2203/0228* (2013.01); *H05K 2201/0154* (2013.01); *H05K 3/022* (2013.01)
USPC ............................................. 428/78; 156/60

(58) Field of Classification Search
CPC ............................................ H01L 2924/01029
USPC .............................................................. 438/78
See application file for complete search history.

(56) References Cited

U.S. PATENT DOCUMENTS

2004/0101696 A1*  5/2004  Yamazaki et al. ............ 428/457

FOREIGN PATENT DOCUMENTS

| JP | 05-304345 | * 11/1993 | ............ H05K 1/05 |
|----|-----------|-----------|-----------------------|
| JP | 1993-304345 | * 11/1993 | |
| JP | 06-045715 | 2/1994 | |
| JP | 11-204903 | 7/1999 | |
| JP | 2001-345472 | 12/2001 | |
| KR | 1020080062285 | 7/2008 | |

OTHER PUBLICATIONS

JP1993-304345A Nov. 1993 Wakamatsu, pdf translation by the JPO website of JP05-304345.*

* cited by examiner

*Primary Examiner* — Aaron Austin
*Assistant Examiner* — Laura Figg
(74) *Attorney, Agent, or Firm* — F. Chau & Associates, LLC

(57) ABSTRACT

There is provided a copper clad laminate (CCL) including: a metal plate; an insulating layer having a planar area greater than that of the metal plate and laminated on the metal plate; and a copper layer laminated on the insulating layer, wherein edges of the insulating layer extend outwardly beyond edges of the metal plate so that an insulation distance insulating the edges of the metal plate from edges of the copper layer is formed. The insulating layer may include a polyimide layer, and a polyimide bonding layer.

5 Claims, 19 Drawing Sheets

CCL AND METHOD OF MANUFACTURING THE SAME

CROSS-REFERENCE TO RELATED APPLICATIONS

This application claims the priority of Korean Patent Application No. 10-2011-0123536 filed on Nov. 24, 2011, in the Korean Intellectual Property Office, the entirety of which is incorporated by reference herein.

TECHNICAL FIELD

The present inventive concept relates to a copper clad laminate (CCL) and a method of manufacturing the same.

DISCUSSION OF THE RELATED ART

In general, some electronic products, such as a light emitting device using a light emitting diode (LED), generate a large amount of heat. Thus, the LED is mounted on a substrate, and a metal core printed circuit board (MCPCB) is used to efficiently dissipate heat from the electronic product through the substrate.

The MCPCB is manufactured by etching a copper clad laminate (CCL). The CCL has a laminate structure of a copper layer for a circuit part, a metal plate for dissipating heat, and an insulating layer interposed therebetween for electrically insulating the copper layer from the metal plate. The insulating layer is formed as a thin layer of about 10 μm by using a material having high heat conductivity so as to increase the electrical insulating properties and heat dissipation effects simultaneously, and efficiently transmits heat produced in the copper layer having the electronic product mounted thereon to the metal plate.

Such an insulating layer of the CCL is required to have high electric insulating properties. However, it is desirable that the insulating layer have an extremely low thickness, and thus it is desirable to confirm the electric insulating properties of each article manufactured. For example, if pin holes or conductive impurities are formed in the insulating layer, the insulating layer will be damaged, and ineffective as an electrical insulator, possibly leading to an undesirable occurrence such as a short circuit or a fire.

Therefore, conventionally, it is necessary to strictly manage the manufacturing of a CCL, and whether the manufactured CCL is defective or not may be determined by measuring a withstand voltage across the insulator. However, since the insulating layer is extremely thin and the copper layer and the metal plate are separated by a distance equal to the thickness of the insulating layer, the use of a low insulation withstand voltage is problematic. It may be difficult to reliably use a sufficient withstand voltage.

SUMMARY

An aspect of the present inventive concept provides a copper clad laminate (CCL) capable of having its withstand voltage measured, by securing an insulation distance sufficient to allow a withstand voltage to be measured and increasing the withstand voltage to a desired level, and a method of manufacturing the same.

According to an aspect of the present inventive concept, there is provided a copper clad laminate (CCL) including: a metal plate; an insulating layer having a planar area greater than that of the metal plate and laminated on the metal plate; and a copper layer laminated on the insulating layer, wherein edges of the insulating layer extend outwardly from (beyond)) edges of the metal plate so that an insulation distance insulating the edges of the metal plate and edges of the copper layer is formed.

The insulation distance may be adjusted to be within a range of 1 mm to 15 mm.

The insulating layer may include a polyimide insulating layer.

The copper layer may be formed to have an area equal to or smaller than that of the insulating layer, such that the insulating layer is exposed along a circumference of the copper layer.

The CCL may further include a polyimide bonding layer interposed between the metal plate and the insulating layer and/or interposed between the insulating layer and the copper layer.

According to another aspect of the present inventive concept, there is provided a method of manufacturing a CCL, the method including: preparing a metal plate and a laminate. The laminate (to be laminated on the metal plate) includes an insulating layer having a planar area greater than that of the metal plate and a copper layer laminated on the insulating layer; laminating the laminate on the metal plate such that edges of the insulating layer extend outwardly beyond edges of the copper layer; and hot pressing the metal plate and the laminate laminated on the metal plate, wherein an insulation distance, sufficient to electrically insulate the edges of the metal plate and edges of the copper layer, is formed by the edges of the insulating layer extending outwardly beyond the edges of the copper plate.

The insulation distance may be adjusted to be within a range of 1 mm to 15 mm.

The copper layer may be formed to have an area equal to or smaller than that of the insulating layer such that the insulating layer is exposed along a circumference of the copper layer.

The insulating layer may include a polyimide insulating layer.

The method further includes: provisionally bonding the metal plate and the laminate using a bonding layer interposed therebetween; and hardening the bonding layer at a high temperature and bonding the metal plate and the laminate laminated on the metal plate to each other.

The laminate may further include the bonding layer interposed between the insulating layer and the copper layer.

The bonding layer may include a polyimide bonding layer.

A copper clad laminate (CCL) and a method of manufacturing the same according to embodiments of the present inventive concept will now be described in detail with reference to the accompanying drawings. This inventive concept may, however, be embodied in many different forms and should not be construed as being limited to the exemplary embodiments set forth herein. Rather, these embodiments are provided so that this disclosure will be thorough and complete, and will fully convey the scope of the inventive concept to those skilled in the art.

Thus, the shapes and sizes of elements in the drawings may be exaggerated for clarity, and like reference numerals denote the same or like elements throughout. Parts having the same or similar functions and operations are denoted by the same reference numerals throughout the drawings.

BRIEF DESCRIPTION OF THE DRAWINGS

The above and other aspects and features of the present inventive concept will be more clearly understood from the following detailed description taken in conjunction with the accompanying drawings, in which.

DETAILED DESCRIPTION OF EXEMPLARY EMBODIMENTS

Figure 1A:
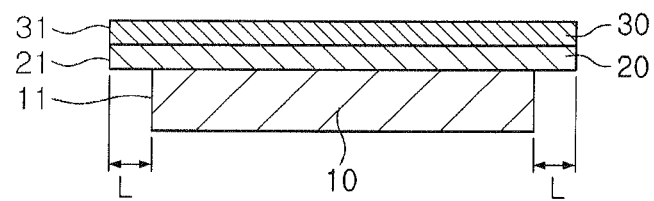
FIGS. 1A and 1B are a cross-sectional view and a plan view schematically illustrating a copper clad laminate (CCL), according to an embodiment of the present inventive concept.
Figure 1B:
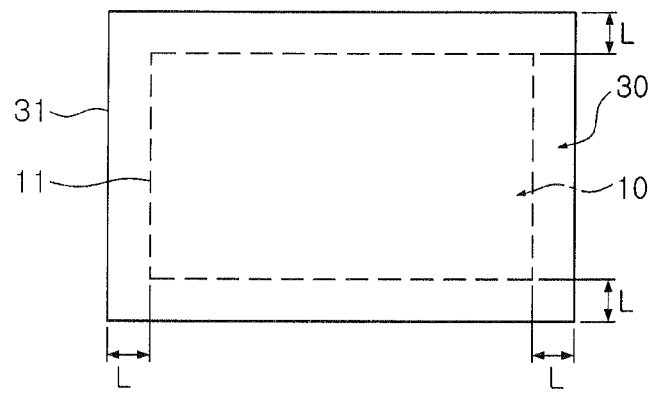
Figure 2A:
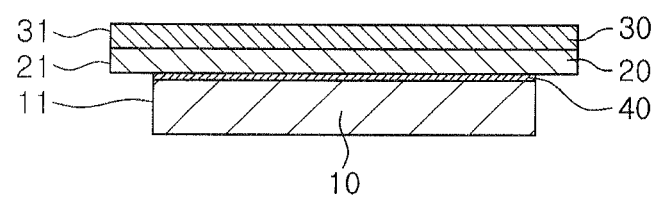
FIGS. 2A and 2B are cross-sectional views schematically illustrating a modification of the CCL of FIG. 1.
Figure 2B:
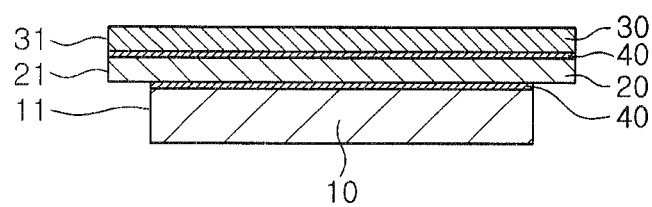

A CCL according to an exemplary embodiment of the inventive concept will be described with reference to FIGS. 1A through 2B. FIGS. 1A and 1B are a cross-sectional view and a plan view schematically illustrating a CCL 1 (1-A), according to an embodiment of the present inventive concept. FIGS. 2A and 2B are cross-sectional views schematically illustrating modifications 1-B and 1-C of the CCL 1 of FIG. 1.

Referring to FIGS. 1A through 2B, the CCL 1 according to exemplary embodiments of the present inventive concept includes a metal plate 10, an insulating layer 20, and a copper layer 30 sequentially laminated on the metal plate 10.

The metal plate 10 may be rectangular, have a standard area (usually 500 mm×600 mm), and may be formed of a metal having excellent heat conductivity, such as aluminum (Al). The area and material of the metal plate 10 are not specifically limited and may be changed in various ways.

The insulating layer 20 may be laminated on the metal plate 10, and may have a planar area greater than that of the metal plate 10. More specifically, the insulating layer 20 may have a shape corresponding to the metal plate 10, and may have an area greater than that of the metal plate 10.

The insulating layer 20 may include a polyimide insulating layer. An insulating layer formed of epoxy based resin should contain 60~80% filler to enhance its heat conductivity, and have a thickness of 80~100 μm to secure withstand voltage characteristics.

According to an embodiment of the present inventive concept, CCL 1 uses a polyimide resin-based insulating layer 20, having a low level of fragility and a higher level of heat conductivity as compared to epoxy resin-based insulating layer.

Meanwhile, the insulating layer 20 having a structure in which edges 21 of the insulating layer 20 extend outwardly beyond edges 11 of the metal plate 10 may be laminated on the metal plate 10. As shown in FIGS. 1A and 1B, the insulating layer 20 may extend outwardly from the four edges 11 of the metal plate 10 when laminated. Distances extending to the edges 21 of the insulating layer 20 from the edges 11 of the metal plate 10 may be identical to each other.

The extension distance L of the insulating layer 20, i.e. a distance from the edge 11 of the metal plate 10 to the edge 21 of the insulating layer 20, forms an insulation distance L that insulates edges 31 of copper layer 30 from the edges 11 of the metal plate 10, which will be described later. The insulation distance L may be adjusted to be within a range of 1 mm to 15 mm.

The copper layer 30 may be laminated on the insulating layer 20, and may have a shape and an area corresponding to those of the insulating layer 20. The copper layer 30 may later form a plurality of circuit wires (not shown) through a patterning process.

Meanwhile, a polyimide resin-based bonding layer 40 may be interposed between the metal plate 10 and the insulating layer 20. In a case in which the insulating layer 20 is a polyimide insulating layer, the insulating layer 20 may not be easily bonded to the metal plate 10, and thus, the bonding layer 40 may be interposed between the metal plate 10 and the insulating layer 20, thereby achieving firm bonding. In particular, since the bonding layer 40 is polyimide resin-based, like the insulating layer 20, the bonding layer 40 may be advantageously prevented from being damaged during the pressing process. The bonding layer 40 may be interposed between the insulating layer 20 and the copper layer 30.

As described above, the CCL 1 according to the embodiment of the present inventive concept has the structure in which the insulating layer 20 is interposed between the metal plate 10 and the copper layer 30 extends outwardly from the edges 11 of the metal plate 10, thereby securing the sufficient insulation distance L sufficient for a withstand voltage test by the extension distance. Thus, in a case in which the withstand voltage test is conducted in order to determine whether the insulating layer 20 has any defects such as pin holes or conductive impurities, a voltage of at least 1 kV is necessary. The conventional CCL has a very low insulation withstand voltage since the copper layer 30 and the metal plate 10 are exposed by a very short distance (usually about several tens of μm) of the thickness of the insulating layer 20, and accordingly, it is difficult to detect a defect during a withstand voltage test involving several hundreds of volts. Thus, the CCL 1 according to the embodiment of the present inventive concept secures the sufficient insulation distance L between the copper layer 30 and the metal plate 10 as illustrated, thereby allowing for stability during the withstand voltage test. Although the insulation distance L is limited to being 15 mm or less in the present embodiment of the present inventive concept, even in the case that the insulation distance L exceeds 15 mm, the withstand voltage test can be conducted.

A CCL according to another embodiment of the present inventive concept will now be described with reference to FIG. 3. The CCL described with reference to FIG. 3 has substantially the same structure as the CCL 1 described with reference to FIGS. 1A through 2B. However, since a structure of a copper layer of FIG. 3 is different from that of FIGS. 1A through 2B, the redundant descriptions therebetween will be omitted here, and the structure of the copper layer will be described below.

Figure 3:
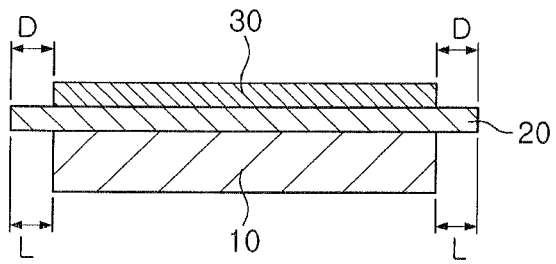
FIG. 3 is a schematic cross-sectional view of a CCL, according to another embodiment of the present inventive concept.

FIG. 3 is a schematic cross-sectional view of a CCL 1-D, according to another embodiment of the present inventive concept.

Referring to FIG. 3, the copper layer 30 may have a structure in which an area thereof is smaller than that of the insulating layer 20 to have the insulating layer 20 exposed through the boundary portion thereof. Accordingly, an insulation distance by which the insulating layer 20 insulates the copper layer 30 from the metal plate 10 is increased by adding a distance extending from the edges of the metal plate 10 to a distance of the exposed boundary portion of the copper layer 30. Thus, a sufficient insulation distance sufficient for a withstand voltage test may be advantageously secured.

A method of manufacturing a CCL according to an embodiment of the present inventive concept will be described with reference to FIGS. 4 through 6.

Figure 4:
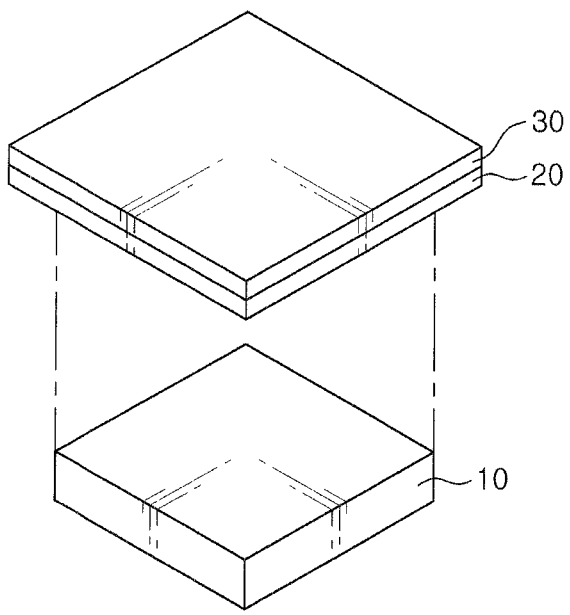
FIGS. 4 through 6 are sequential schematic diagrams illustrating a method of manufacturing a CCL, according to an embodiment of the present inventive concept.
Figure 5:
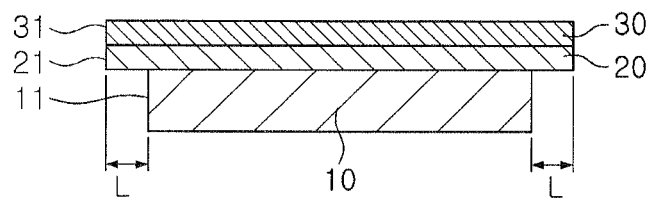
Figure 6:
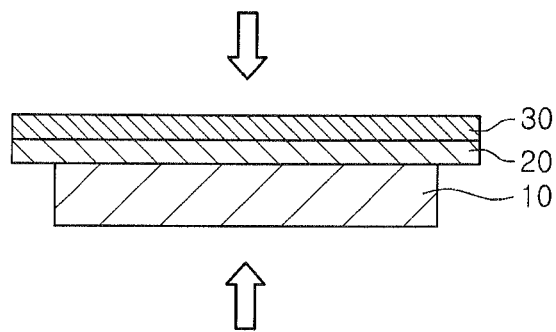

FIGS. 4 through 6 are sequential schematic diagrams illustrating a method of manufacturing a CCL, according to an embodiment of the present inventive concept.

Referring to FIG. 4, a laminate including the metal plate 10, the insulating layer 20 having a planar area greater than that of the metal plate 10 and laminated on the metal plate 10, and the copper layer 30 laminated on the insulating layer 20 is prepared.

The metal plate 10 may be rectangular, have a standard area (usually 500 mm×600 mm), and may be formed of a metal having excellent heat conductivity, such as aluminum (Al). The insulating layer 20 and the copper layer 30 may have shapes corresponding to the metal plate 10, and may have an area greater than the metal plate 10.

The insulating layer 20 may include a polyimide insulating layer. An area of the copper layer 30 may be equal to or smaller than that of the insulating layer 20 so that the insulating layer 20 may be partially exposed through the boundary portion of the copper layer 30.

Referring to FIG. 5, the laminate is laminated on the metal plate 10 in such a manner that the edges 21 of the insulating layer 20 extend outwardly beyond the edges 11 of the metal plate 10.

More specifically, the insulating layer 20 having a structure in which the edges 21 of the insulating layer 20 extend outwardly from the edges 11 of the metal plate 10 may be laminated on the metal plate 10. As shown in FIG. 5, the insulating layer 20 may extend outwardly beyond the four edges 11 of the metal plate 10 when laminated. The insulating layer 20 may be laminated on the metal plate 10 in such a manner that the metal plate 10 is disposed in the center of the insulating layer 20, and thus distances extending beyond the edges 11 of the metal plate 10 to the edges 21 of the insulating layer 20 may be identical.

An extension distance of the insulating layer 20, i.e. the distance from the edges 11 of the metal plate 10 to the edges 21 of the insulating layer 20, forms the insulation distance L that insulates the edges 31 of the copper layer 30 from the edges 11 of the metal plate 10. Thus, the insulating layer 20 forms the insulation distance L that insulates the edges 11 of the metal plate 10 from the edges 31 of the copper layer 30 by the distance from the edges 11 of the metal plate 10 to the edges 21 of the insulating layer 20. The insulation distance L may be adjusted to be within a range of 1 mm to 15 mm.

Referring to FIG. 6, the CCL in which the insulation distance L is secured is manufactured by performing hot pressing (note opposing arrows) together the metal plate 10 and the laminate laminated on the metal plate 10 in a pressing process, and bonding the metal plate 10 and the laminate to each other.

Figure 7:
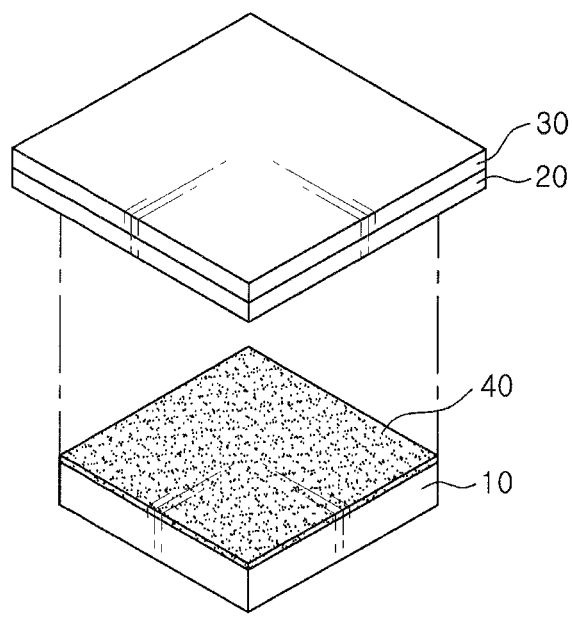
FIGS. 7 through 9 are sequential schematic diagrams illustrating a method of manufacturing a CCL, according to another embodiment of the present inventive concept.
Figure 8:
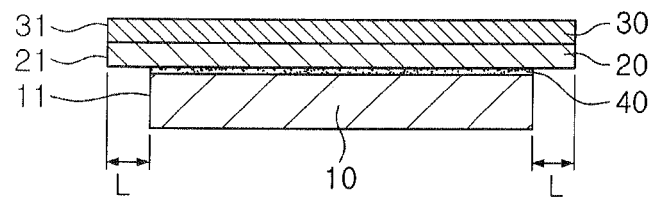
Figure 9:
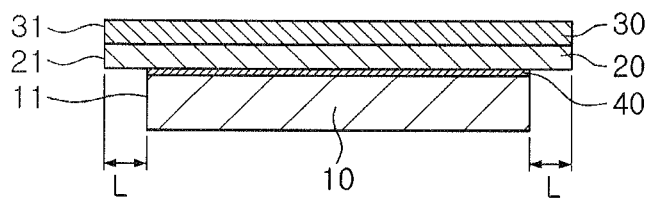

A method of manufacturing a CCL according to another embodiment of the present inventive concept will be described with reference to FIGS. 7 through 9. FIGS. 7 through 9 are sequential schematic diagrams illustrating a method of manufacturing a CCL, according to another embodiment of the present inventive concept.

Referring to the exploded view in FIG. 7, a laminate includes the metal plate 10, the insulating layer 20 having a planar area greater than that of the metal plate 10 and laminated on the metal plate 10, and the copper layer 30 laminated on the insulating layer 20 is prepared.

The metal plate 10 may be rectangular, have a standard area (usually 500 mm×600 mm), and may be formed of a metal having excellent heat conductivity, such as aluminum (Al). The insulating layer 20 and the copper layer 30 may have shapes corresponding to the metal plate 10, and may have an area greater than that of the metal plate 10.

The insulating layer 20 may include a polyimide insulating layer. An area of the copper layer 30 may be equal to or smaller than that of the insulating layer 20 so that the insulating layer 20 may be partially exposed through the boundary portion of the copper layer 30.

Although not shown, the polyimide resin-based bonding layer 40 may be further interposed between the insulating layer 20 and the copper layer 30.

Referring to FIG. 8, the polyimide resin-based bonding layer 40 is disposed on the metal plate 10, the laminate is laminated on the metal plate 10 on which the bonding layer 40 is disposed in such a manner that the edges 21 of the insulating layer 20 extend outwardly beyond the edges 11 of the metal plate 10, and the metal plate 10 and the laminate are provisionally bonded to each other through the bonding layer 40 interposed between the metal plate 10 and the laminate.

More specifically, the insulating layer 20 having a structure in which the edges 21 of the insulating layer 20 extend outwardly beyond the edges 11 of the metal plate 10 may be laminated on the bonding layer 40. As shown in FIG. 8, the insulating layer 20 having a structure in which the insulating layer 20 extends outwardly beyond the four edges 11 of the metal plate 10 may be laminated. The insulating layer 20 may be laminated on the metal plate 10 in such a manner that the metal plate 10 is disposed in the center of the insulating layer 20, and thus distances extending beyond the four edges 11 of the metal plate 10 to the edges 21 of the insulating layer 20 may be identical to each other.

An extension distance of the insulating layer 20, i.e. a distance from the edges 11 of the metal plate 10 to the edges 21 of the insulating layer 20, is the insulation distance L that insulates the edges 11 of the metal plate 10 from the edges 31 of the copper layer 30. Thus, the insulating layer 20 forms the insulation distance L that insulates the edges 11 of the metal plate 10 from the edges 31 of the copper layer 30 by the distance extending from the edges 11 of the metal plate 10. The insulation distance L may be adjusted to be within the range of 1 mm to 15 mm.

Referring to FIG. 9, the CCL in which the insulation distance L is secured is manufactured by hardening the bonding layer 40 at a high temperature in a vacuum chamber (not shown), and firmly bonding the metal plate 10 and the laminate laminated on the metal plate 10 to each other.

A method of manufacturing a CCL according to an embodiment of the present inventive concept will be described with reference to FIGS. 10 through 14. FIGS. 10 through 14 are sequential schematic diagrams illustrating a method of manufacturing a CCL, according to another embodiment of the present inventive concept.

Figure 10:
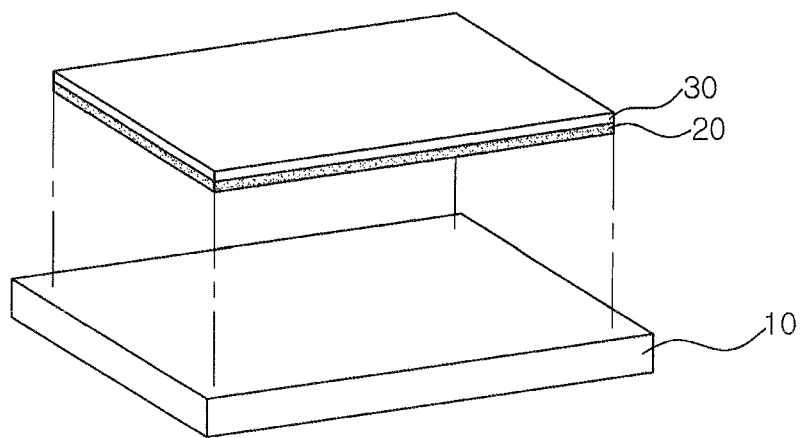
FIGS. 10, 11A, 11B, 12, 13A, 13B, 14A, and 14B are sequential schematic diagrams illustrating a method of manufacturing a CCL, according to another embodiment of the present inventive concept.

Referring to FIG. 10, the metal plate 10, and the copper layer 30 and the insulating layer 20 that are smaller than the metal plate 10, are prepared.

The metal plate 10 may be rectangular, have a standard area (usually 500 mm×600 mm), and may be formed of a metal having excellent heat conductivity, such as aluminum (Al). The insulating layer 20 and the copper layer 30 may have shapes corresponding to the metal plate 10, and may have an area smaller than that of the metal plate 10. The insulating layer 20 and the copper layer 30 may be prepared separately or as a laminate as shown in the FIG. 10.

Figure 11A:
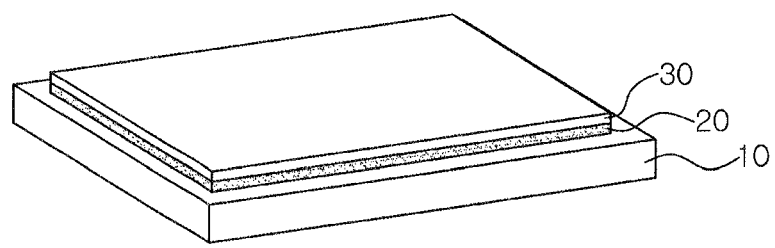

Referring to FIG. 11A, the laminate including the copper layer 30 and the insulating layer 20 is laminated on the metal plate 10 in such a manner that a portion of a top surface of the metal plate 10 is exposed in an insulation region S corresponding to the distance between a circumference of the metal plate 10 and the circumference of the laminate. In this regard, the insulating layer 20 is interposed between the copper layer 30 and the metal plate 10.

Figure 11B:
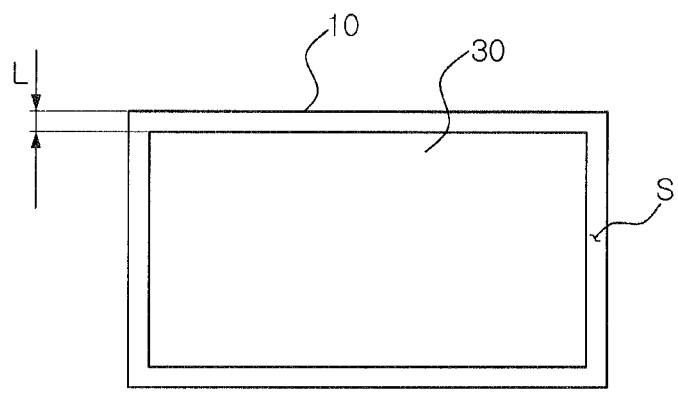

More specifically, as shown in FIG. 11B, while the laminate including the copper layer 30 and the insulating layer 20 is laminated on the metal plate 10, the laminate is laminated in the center of the metal plate 10 so that the boundary portion (in region S) of the metal plate 10 is wholly exposed. In this case, the portion of the metal plate 10 exposed beyond the boundary portion of the laminate corresponds to the insulation region S, which will be described later, and the distance between the circumference of the metal plate 10 and the circumference of the laminate corresponds to the insulation distance L.

Figure 12:
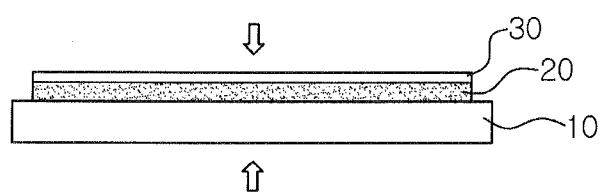
Figure 13A:
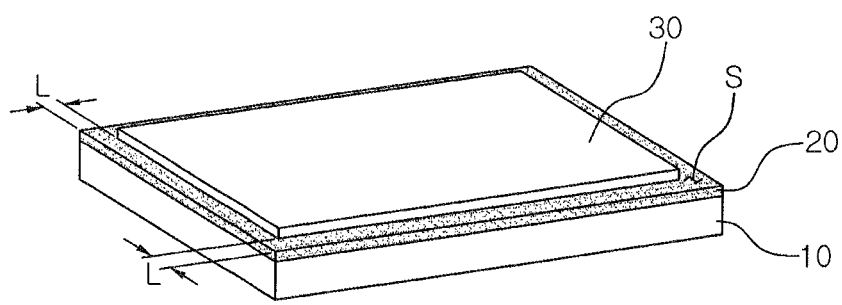
Figure 13B:
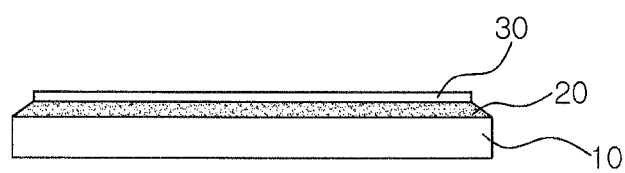

Referring to FIG. 12, the metal plate 10 and the laminate are bonded to each other by performing hot pressing thereupon (note opposing arrows). During hot pressing shown in FIG. 12, the exposed portion of the metal plate 10 is covered by an overflow of the insulating layer 20 material interposed between the copper layer 30 and the metal plate 10 expelled by hot pressing as shown in FIGS. 13A and 13B. Thus, the insulating layer 20 is overflowed along the surface of the metal plate 10 by pressing the insulating layer 20 having a half-hardened status at a high temperature, and thus, the exposed portion of the metal plate 10 is covered. Accordingly, the insulation region S surrounding the circumference of the copper layer 30 is formed as shown in FIGS. 13A and 13B. The insulation region S has the insulation distance L corresponding to the distance between the circumference of the copper layer 30 and the circumference of the metal plate 10. The insulation distance L may be between 6 mm and 10 mm, but is not limited thereto.

Figure 14A:
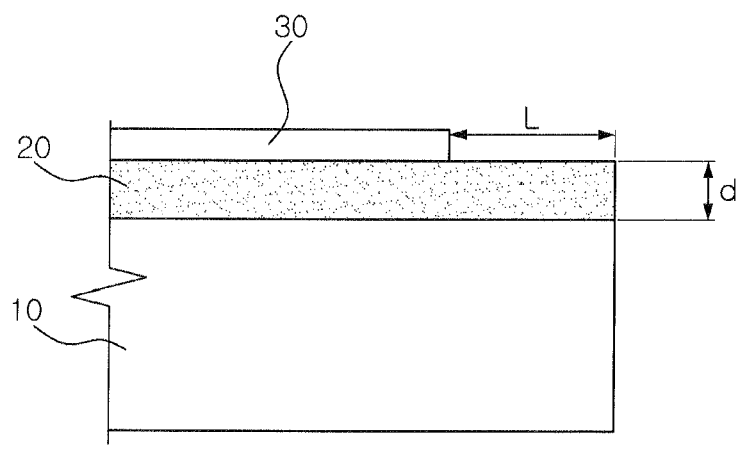
Figure 14B:
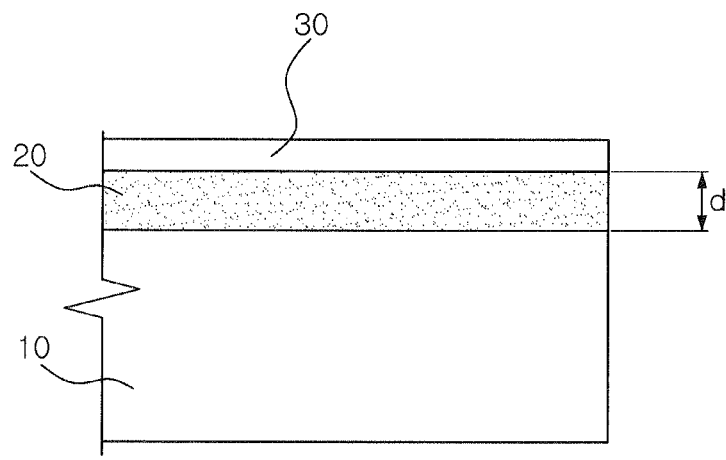

In the CCL manufactured according to an embodiment of the present inventive concept, as shown in FIG. 14A, the thickness of the metal plate 10 is greater than that of the copper layer 30 and of the insulating layer 20, and the a laminate cross-section has a step structure in which an edge portion of the metal plate 10 is exposed, and thus a sufficient insulation distance L+d is formed, thereby allowing for a withstand voltage test to be conducted. Thus, in a case in which the withstand voltage test is conducted to determine whether the insulating layer 20 has any defects such as pin holes or conductive impurities, a voltage of at least 1 kV is sufficient. As shown in FIG. 14A, in the case in which a sufficient insulation distance between the copper layer 30 and the metal plate 10 is secured, the withstand voltage test can be reliably conducted. On the other hand, as shown in FIG. 14B, a relatively short insulation distance d, equal to the thickness of the insulating layer 20 in a laminate edge portion of the conventional CCL, is present between the copper layer 30 and the metal plate 10, and thus, an insulation withstand voltage may be very low, and accordingly, it may be difficult to detect a defect during a withstand voltage test involving only several hundreds of volts.

In this method of manufacturing the CCL according to an embodiment of the present inventive concept, the removal of the copper layer 30 by etching is unnecessary, and thus, masking and developing processes required in a common etching method are omitted.

Meanwhile, a modification of a method of manufacturing the CCL of FIGS. 10 through 14 will be described with reference to FIGS. 15 through 18. FIGS. 15 through 18 are schematic diagrams illustrating a modification of the method of manufacturing the CCL of FIGS. 10 through 14. The method of manufacturing the CCL of FIGS. 15 through 18 is substantially the same as the method of manufacturing the CCL of FIGS. 10 through 14, and thus only differences therebetween will be described in detail.

Figure 15:
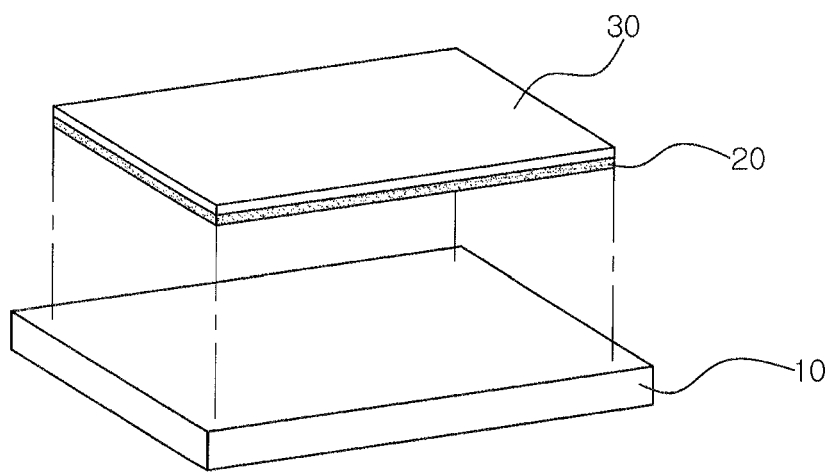
FIGS. 15, 16A, 16B, 17, and 18 are schematic diagrams illustrating a modification of the method of manufacturing the CCL of FIGS. 10, 11A, 11B, 12, 13A, 13B, 14A and 14B.

Referring to FIG. 15, the metal plate 10 and a laminate including the copper layer 30 and the insulating layer 20, are prepared. The copper layer 30 and the insulating layer 20 are smaller than the metal plate 10.

Figure 16A:
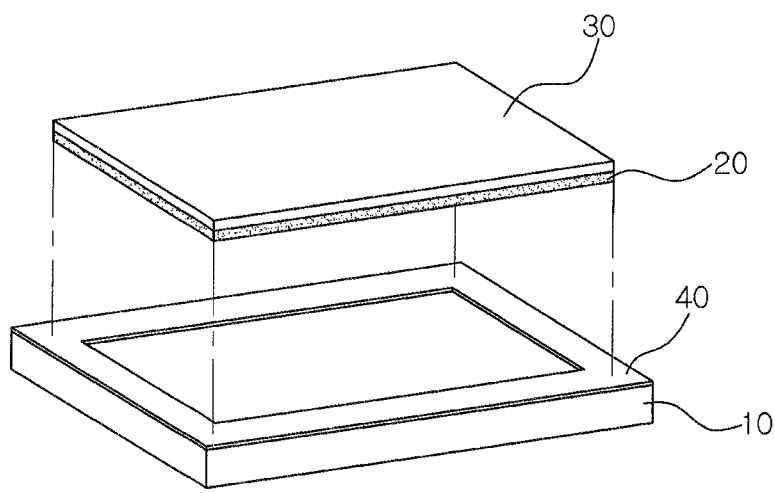
Figure 16B:
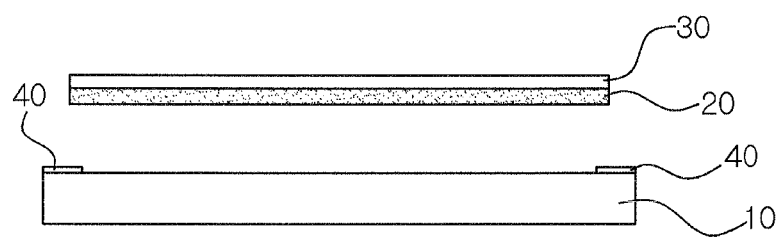

Referring to FIGS. 16A and 16B, an insulating film 40 is attached along an exposed boundary portion of the metal plate 10. More specifically, the insulating film 40 is attached to cover the boundary portion of the metal plate 10 corresponding to the insulation region S of the top surface of the metal plate 10 as shown in FIGS. 10 through 14. The insulating film 40 may have an area relatively greater than the insulation region S but is not limited thereto. The insulating film 40 may be a heat resistant film such that the insulating film 40 is not affected by hot pressing performed at a temperature of approximately 200° C.

Figure 17:
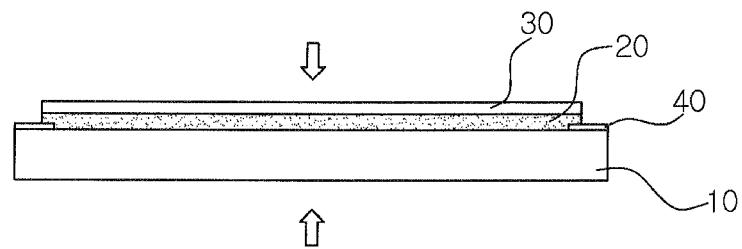
Figure 18:
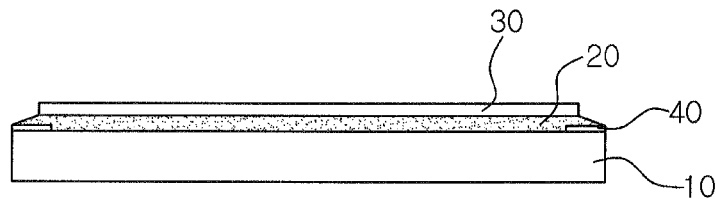

As shown in FIG. 17, the laminate including the copper layer 30 and the insulating layer 20 is laminated on the metal plate 10 in a manner such that the insulating film 40 covering the insulation region of the metal plate 10 is exposed. The metal plate 10 and the laminate are bonded to each other through hot pressing. As shown in FIG. 18, the insulating layer 20 interposed between the copper layer 30 and the metal plate 10 is overflowed by hot pressing to cover the insulating film 40.

As described above, in a case in which the insulating film 40 is previously attached to the exposed portion of the metal plate 10, even if the exposed portion of the metal plate 10 is not wholly covered due to lack of an overflow section of the insulating layer 20, the exposed portion is wholly covered by the insulating film 40, thereby securing the sufficient insulation region S.

Meanwhile, a method of manufacturing a CCL according to another embodiment of the present inventive concept will be described with reference to FIGS. 19 through 24. FIGS. 19 through 24 are sequential schematic diagrams illustrating a method of manufacturing a CCL, according to another embodiment of the present inventive concept.

Figure 19:
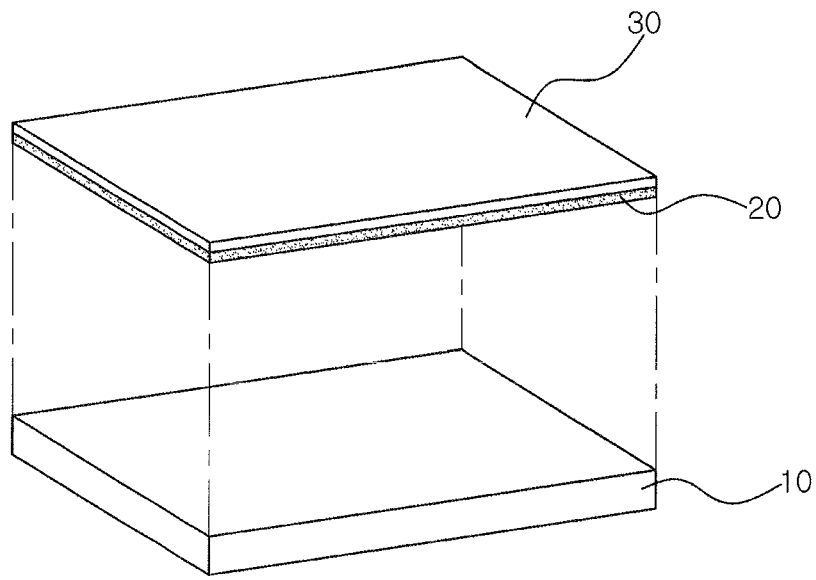
FIGS. 19 through 24 are sequential schematic diagrams illustrating a method of manufacturing a CCL, according to another embodiment of the present inventive concept.

Referring to FIG. 19, the metal plate 10, as well as the copper layer 30 and the insulating layer 20, having areas corresponding to an area of the metal plate 10, are prepared.

The metal plate 10 may be rectangular, have a standard area (usually 500 mm×600 mm), and may be formed of aluminum (Al) having excellent heat conductivity. The insulating layer 20 and the copper layer 30 may have shapes corresponding to the metal plate 10, and may have areas corresponding to the metal plate 10. The insulating layer 20 and the copper layer 30 may be prepared separately or as a laminate as shown in FIG. 19.

Figure 20:
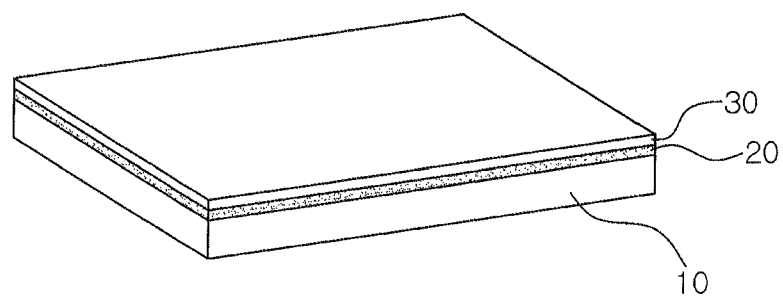
Figure 21:
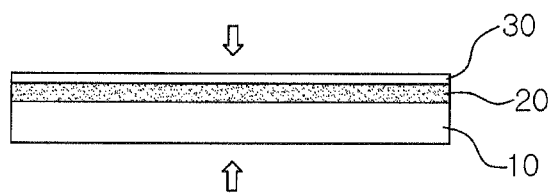

Referring to FIG. 20, the laminate including the copper layer 30 and the insulating layer 20 is laminated on the metal plate 10. Referring to FIG. 21, the metal plate 10 and the laminate are bonded to each other by performing hot pressing thereupon.

Figure 22:
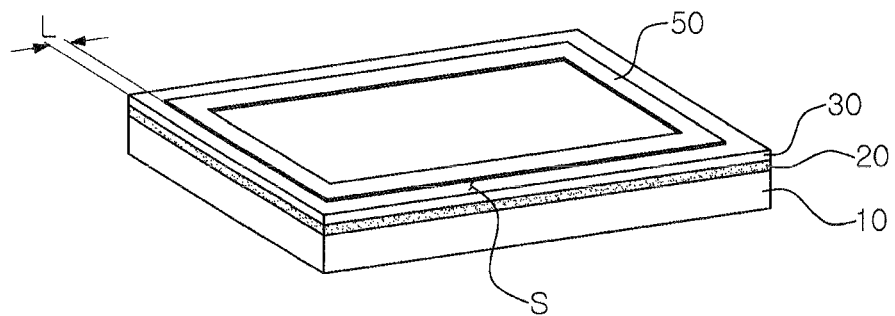

Referring to FIG. 22, the insulation region S having an area set inwardly from the circumferential edge of the copper layer 30 along the circumference thereof is defined on the surface of the copper layer 30. More specifically, the operation of defining the insulation region S according to the present embodiment includes an operation of placing a tape 50 on the surface of the copper layer 30 along the inner surface of the insulation region S as shown in FIG. 22. Thus, the tape 50 is attached inwardly of the circumference of the copper layer 30 while having a predetermined distance from the circumferential edge of the copper layer 30. In this case, a region between an outer edge of the tape 50 and the circumference (the circumferential edge) of the copper layer 30 is defined as the insulation region S. A distance between the outer edge of the tape 50 and the circumference of the copper layer 30 corresponds to the insulation distance L.

Figure 23:
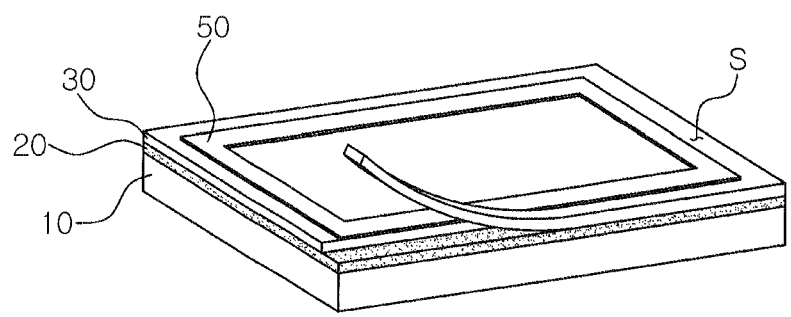

Referring to FIG. 23, a portion of a top surface of the insulating layer 20 is exposed by removing the circumference of the copper layer 30 to form the defined insulation region S. More specifically, the boundary portion of the copper layer 30 beyond the outer edge of the tape 50 is removed. The portion of the copper layer 30 formed in the insulation region S is removed. Thus, the portion of the top surface of the insulating layer 20 is exposed beyond the removed circumference of the copper layer 30 to form the insulation region S.

Figure 24:
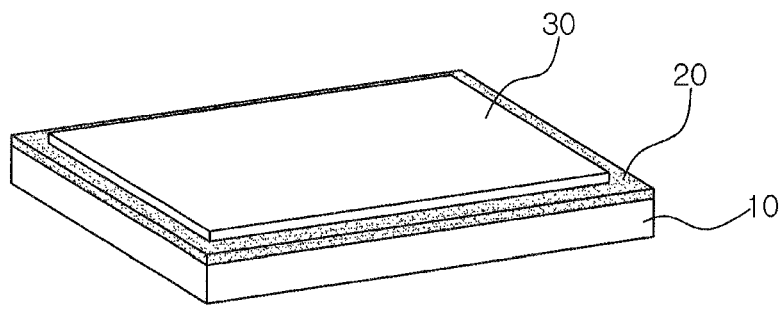

Referring to FIG. 24, the CCL is manufactured having a step structure in which a laminate cross section is exposed at an edge portion. The tape 50 is removed from the surface of the copper layer 30.

Meanwhile, a method of manufacturing a CCL according to another embodiment of the present inventive concept will now be described with reference to FIGS. 19 through 21 and 25 (FIGS. 25A+25B) through 27.

Operations of laminating and hot pressing the metal plate 10, the insulating layer 20, and the copper layer 30 described with reference to FIGS. 19 through 21 are the same as the manufacturing method described above. However, an operation of defining the insulation region S on the surface of the copper layer 30 according to the present embodiment that is different from the operation of defining the insulation region S described above will be described in detail.

Figure 25A:
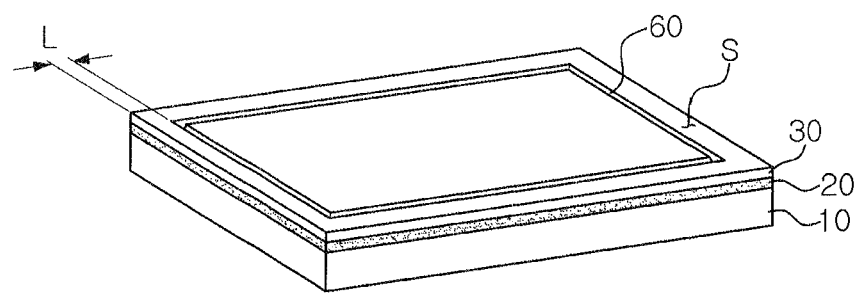
FIGS. 25A, 25B, 26, and 27 are sequential schematic diagrams illustrating a method of manufacturing a CCL, according to another embodiment of the present inventive concept.

Referring to FIG. 25A, the insulation region S having an area set inwardly from the circumferential edge of the copper layer 30 along the circumference thereof is defined on the surface of the copper layer 30. More specifically, the operation of defining the insulation region S according to the present embodiment includes an operation of forming or cutting a groove 60 in the surface of the copper layer 30 along the inner edge of the insulation region S as shown in FIG. 25A. Thus, the groove 60 is formed inwardly from the circumferential edge of the copper layer 30 along the circumference of the copper layer 30 by a predetermined distance from the circumferential edge of the copper layer 30.

Figure 25B:
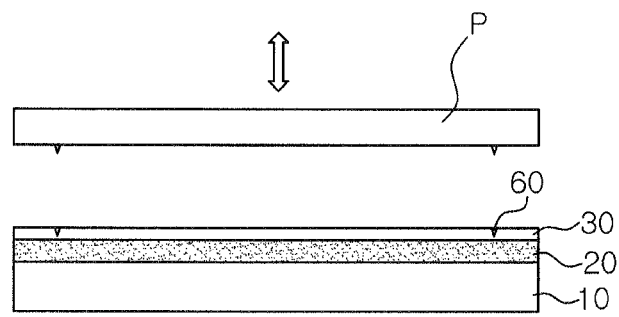

The groove 60 may be formed by pressing punching using a mold punch P as shown in FIG. 25B. In this case, a region between the groove 60 and the outer circumference (the circumferential edge) of the copper layer 30 is defined as the insulation region S. The distance between the cutting groove 60 and the outer circumference of the copper layer 30 corresponds to the insulation distance L.

Figure 26:
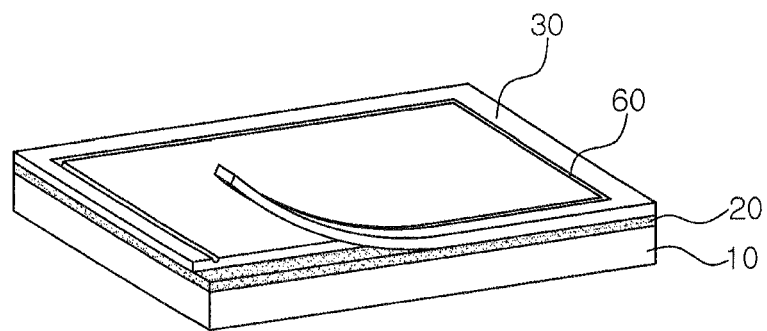
Figure 27:
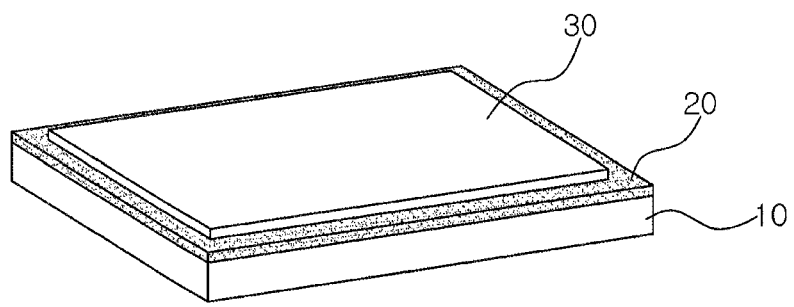

After forming the groove 60 on the surface of the copper layer 30, referring to FIG. 26, a portion of the copper layer 30 corresponding to the insulation region S is removed beyond and along the groove 60, thereby removing the boundary portion of the copper layer 30. Therefore, referring to FIG. 27, the portion of the top surface of the insulating layer 20 is exposed through the removed boundary portion of the copper layer 30 corresponding to the insulation region 5, and thus the CCL having a sufficient insulation region S sufficient for a withstand voltage test may be manufactured.

Figure 28:
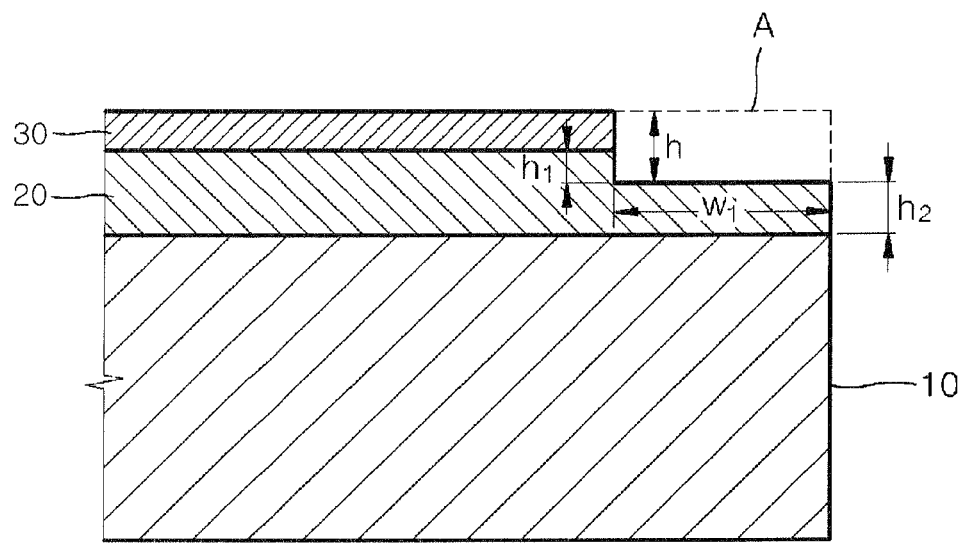
FIG. 28 is a schematic cross-sectional view of a CCL, according to another embodiment of the present inventive concept.

FIG. 28 is a schematic cross-sectional view of a CCL, according to another embodiment of the present inventive concept. Referring to FIG. 28, the CCL according to another embodiment of the present inventive concept includes the insulating layer 20 formed on the metal plate 10 and the copper layer 30 formed on the insulating layer 20. A step region in which the insulating layer 20 is exposed upwardly is formed in at least one edge portion of the CCL.

The metal plate 10 may be formed of a material having good heating characteristics, for example, a metal such as Al, Fe, or the like or an alloy thereof, and may have a single layer or multilayer structure. The insulating layer 20 may basically be formed of a material having insulating characteristics, and an inorganic material or an organic material. For example, the insulating layer 20 may be formed of epoxy-based insulating resin, and may include a metal powder such as Al powder in order to enhance heat conductivity. The copper layer 30 may usually be formed of a Cu thin film.

Referring to FIG. 28, the CCL according to the present embodiment may be formed such that a distance of an exposed region of one edge portion of the insulating layer 20, i.e. an insulation distance (W1), is greater than the thickness (h1+h2) of the insulating layer 20. In this case, the insulation distance may indicate the distance of the exposed region of the insulating layer 20 between the metal plate 10 and the copper layer 30. When observed from above the CCL, a width of the exposed region of the insulating layer 20 is referred to as an exposed width W1. A region A of the lamination of FIG. 28 is removed during the manufacturing of the CCL such that the CCL has a step structure in which a portion thereof is removed downwardly from the surface of the copper layer 30 by a depth h and the insulating layer 20 is exposed by the exposed width W1. The region A of lamination of FIG. 28 may be removed by a polishing process during the manufacturing of the CCL. In a case in which an edge portion of the CCL is not so removed, the insulation distance is only thickness (h1+h2) of the insulating layer 20; however, if a portion of the edge portion is removed as described above, then an insulation distance approximately equal to the exposed width W1 may be further secured. Accordingly, in a case in which a withstand voltage test is conducted on the CCL, the CCL may have a structure in which a possibility of conduction between the metal plate 10 and the copper layer 30 in the edge portion is minimized.

The thickness (h1+h2) of the insulating layer 20 may be between several tens of micrometers and several hundreds of micrometers, and the removed thickness h1 of the insulating layer 20 may be selectively determined. Persons skilled in the art will recognize that if the removed thickness h1 is excessively small, then the copper layer 30 may remain, and if the removed thickness h1 is excessively large, the metal plate 10 may be exposed, and thus an appropriate thickness may be selected. The copper layer 30 may have a thickness of several micrometers. The overall removed thickness h of the insulating layer 20 and the copper layer 30 may be determined in consideration of the thickness of the insulating layer 20.

The CCL according to the embodiment of the present inventive concept may be formed by sequentially laminating the metal plate 10, the insulating layer 20, and the copper layer 30, and then removing a part of one edge portion thereof. A process of laminating the insulating layer 20 and the copper layer 30 on the metal plate 10 may use a commonly known process of manufacturing a CCL for a printed circuit board (PCB). However, the process of removing one edge portion of the CCL may be performed by using, for example, a mechanical processing process, for example, a polishing process, and in particular, a mechanical processing process such as end milling processing, router processing, or grinder processing. The CCL of FIG. 28 may be formed by removing the copper layer 30 and the insulating layer 20 by a depth h in a thickness direction, i.e. in a direction perpendicular to the interface of the insulating layer 20 and the copper layer 30 by using a mechanical processing process, and removing the copper layer 30 and the insulating layer 20 by a width W1 in a horizontal direction of the interface of the insulating layer 20 and the copper layer 30.

Even though the edge portion of the copper layer 30 may be removed by using a chemical process such as an etching process, the procedure thereof such as a mask process and a developing process, may be complicated, relatively expensive, and a part of the copper layer 30 may remain, and thus processing efficiency may deteriorate as compared to a case in which the mechanical processing process is used.

Figure 29:
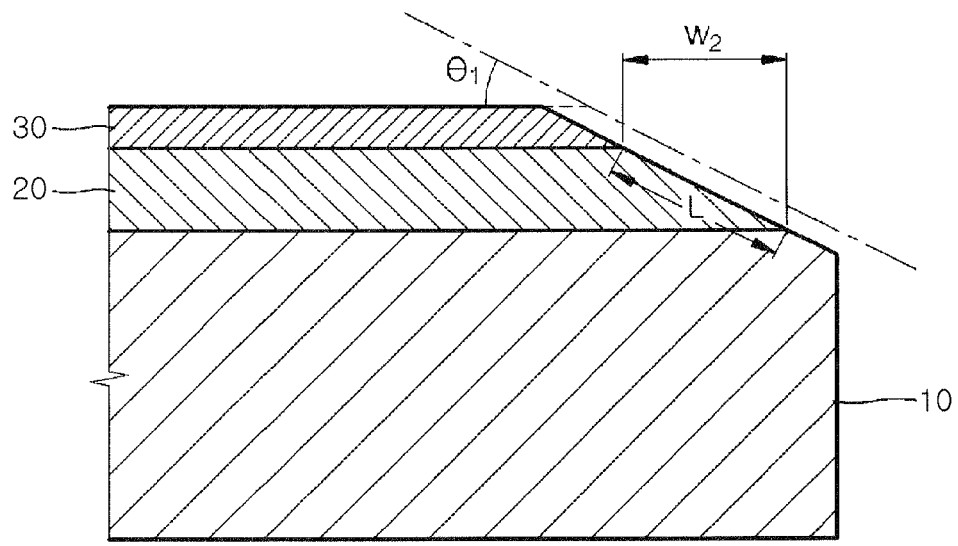
FIG. 29 is a schematic cross-sectional view of a CCL, according to another embodiment of the present inventive concept.

FIG. 29 is a schematic cross-sectional view of a CCL, according to another embodiment of the present inventive concept. Referring to FIG. 29, the CCL according to another embodiment of the present inventive concept includes the insulating layer 20 formed on the metal plate 10 and the copper layer 30 formed on the insulating layer 20. The insulating layer 20 and the copper layer 30 may include a region removed at a predetermined inclination angle θ1, and the metal plate 10 may include a corresponding region removed at the predetermined inclination angle θ1.

In a comparison between FIGS. 28 and 29, the CCL of FIG. 28 has a step structure in which the insulating layer 20 is exposed upwardly at an edge portion of the CCL, while the CCL of FIG. 29 has an inclination surface structure in which the insulating layer 20 is exposed upwardly diagonally along an edge portion of the CCL. The CCL of FIG. 29 may be formed by removing the insulating layer 20 and the copper layer 30 at the predetermined inclination angle θ1 (θ1 being not equal to 90 degrees), and selectively removing materials from the edge portion of the metal plate 10.

In this regard, the inclination angle θ1 is an angle formed by the interface of the insulating layer 20 and the copper layer 30 and the edge portions of the insulating layer 20 and the copper layer 30, and may be selectively determined so as to secure the insulation distance L desired in view of the thickness of the insulating layer 20. The inclination angle θ1 may be selected in a range of 0<θ1<90 degrees. The higher the inclination angle θ1 is, the more the insulation distance L and a width W2 of an exposed region of the insulating layer 20 are reduced, while the lower the inclination angle θ1 is, the greater the insulation distance L and the width W2 of the exposed region of the insulating layer 20 are increased, and thus, the inclination angle θ1 may be selected to be lower, for example, in a range of 0<θ1<45 degrees, so as to secure a longer insulation distance L.

Figure 30A:
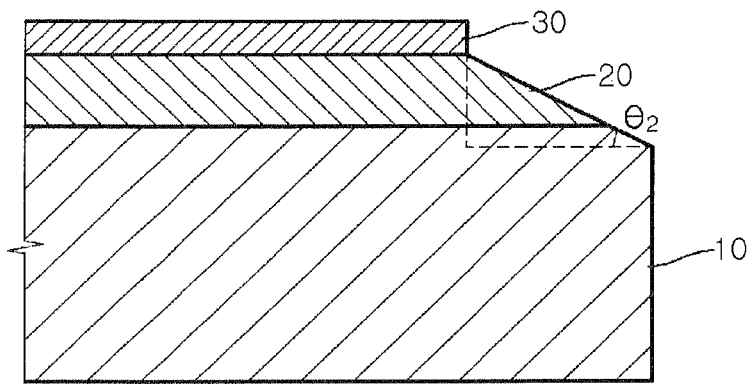
FIGS. 30A through 30C are cross-sectional views of CCLs, according to various embodiments of the present inventive concept.
Figure 30B:
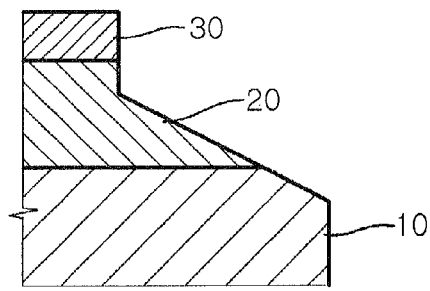
Figure 30C:
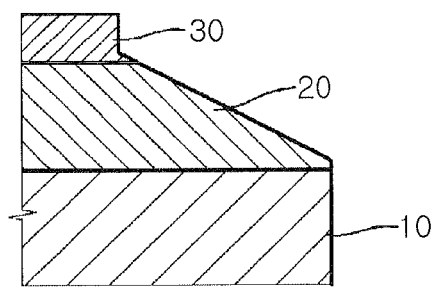

FIGS. 30A through 30C are cross-sectional views of parts of CCLs, according to various embodiments of the present inventive concept. Referring to FIGS. 30A through 30C, the edge portion of various CCLs have a shape being a combinations of a step structure and an inclination surface structure.

Referring to FIG. 30A, the CCL according to an embodiment of the present inventive concept has a structure in which an inclination surface is formed in the insulating layer 20, and the copper layer 30 is removed perpendicularly downwardly. The CCL of FIG. 30A may be formed by removing the insulating layer 20 at a predetermined inclination angle θ2 after the insulating layer 20 is exposed by removing the copper layer 30 downwardly by using a mechanical processing process.

FIG. 30B shows the CCL having a structure in which edge portions of the insulating layer 20 and the metal plate 10 have inclination surfaces, and a portion of the insulating layer 20 and the full-thickness of copper layer 30 are removed vertically downwardly. The CCL of FIG. 30B may be formed by removing the portion of the insulating layer 20 downwardly while performing a process of removing the copper layer 30 downwardly and then removing the insulating layer 20 and the metal plate 10 at a predetermined angle.

FIG. 30C shows the CCL having a structure in which an inclination surface is formed in parts of the insulating layer 20 and the copper layer 30. The CCL of FIG. 30C is formed by removing a part of the copper layer 30 downwardly and removing the other parts of the copper layer 30 and the insulating layer 20 at a predetermined angle.

The shapes of the edge portions of the CCLs of FIGS. 30A through 30C may be slightly differently formed due to a processing error in the mechanical processing process that may occur during the process of removing one edge portion of the CCL by using mechanical processing, for example, a polishing error. Although the CCL has substantially any shape, the insulation distance between the metal plate 10 and the copper layer 30 may be secured, and the possibility of conduction between the metal plate 10 and the copper layer 30 may be minimized.

Figure 31:
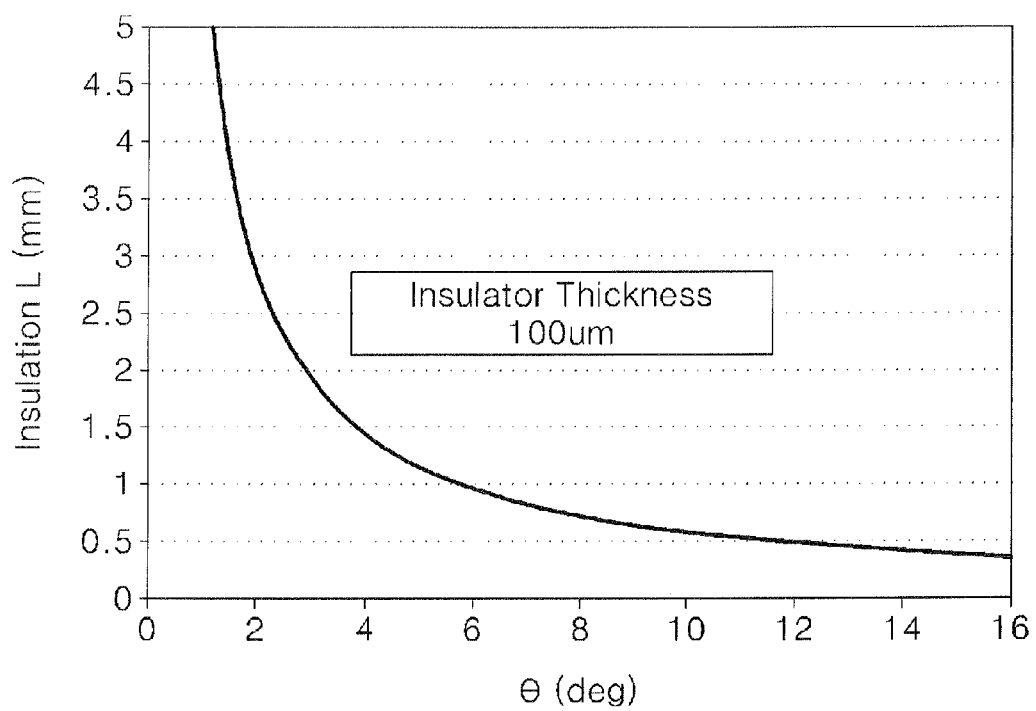
FIG. 31 is a graph depicting insulation distance with respect to a CCL polishing angle, according to an embodiment of the present inventive concept.

FIG. 31 is a graph of an insulation distance with respect to a polishing angle of a CCL, according to various embodiments of the present inventive concept. The graph shows a relationship between an inclination angle θ (e.g., θ1) of one edge portion of the CCL and the insulation distance according to an embodiment of the present inventive concept, and a result obtained by measuring the CCL in a case in which the thickness of the insulating layer 20 between the metal plate 10 and the copper layer 30 is 100 micrometers.

Referring to FIG. 31, as described above, the higher the inclination angle θ is, the lower the insulation distance is; and the lower the inclination angle θ is, the more the insulation distance is increased. More specifically, for example, in a case in which the inclination angle θ is 10°, the insulation distance is 0.6 mm, significantly larger than the thickness of the insulating layer 20. In this case, a electrical arc discharge voltage is about 3000 V, and thus a withstand voltage test can be easily performed on the CCL.

For reference, referring to FIGS. 29 and 31, in a case in which the inclination angles θ, θ1 of the CCL are uniformly maintained, the exposed width W1 and the insulation distance L vary with respect to the thickness of the insulating layer 20 of the CCL. Thus, in a case in which the inclination angles θ, θ1 of the CCL are uniformly maintained, the manufactured CCL is observed from above and the exposed width W1 is measured, thereby easily managing a thickness distribution of the insulating layer 20 of the CCL.

As described above, a method of manufacturing the CCL according to one or more embodiments of the present inventive concept can secure an insulation distance by laminating on a metal plate the insulating layer having an area greater than that of the metal plate.

In addition, partial removal of the copper layer through etching is unnecessary to secure the insulation distance, facilitating individual inspections during mass production.

As set forth above, according to exemplary embodiments of the inventive concept, a CCL capable of measuring a withstand voltage by securing an insulation distance sufficient to allow a withstand voltage to be measured and increasing the withstand voltage to a desired level, and a method of manufacturing the same are provided.

While the present inventive concept has been shown and described in connection with the embodiments, it will be apparent to those skilled in the art that modifications and variations can be made without departing from the spirit and scope of the inventive concept as defined by the appended claims.

What is claimed is:

1. A copper clad laminate (CCL) comprising:
a metal plate;
an insulating layer on the metal plate and having a planar area greater than that of the metal plate; and
a copper layer on the insulating layer,
wherein edges of the insulating layer and edges of the copper layer extend outwardly beyond edges of the metal plate so that an insulation distance which electrically insulates the edges of the metal plate from the edges of the copper layer is formed.

2. The CCL of claim 1, wherein the insulation distance is adjusted to be within a range of about 1 mm to about 15 mm.

3. The CCL of claim 1, wherein the insulating layer includes a polyimide insulating layer.

4. The CCL of claim 1, wherein the copper layer is formed to have an area equal to or smaller than that of the insulating layer, such that the insulating layer is exposed along a circumference of the copper layer.

5. The CCL of claim 1, further comprising a polyimide bonding layer interposed between the metal plate and the insulating layer and/or interposed between the insulating layer and the copper layer.

* * * * *